United States Patent [19]

Bonner

[11] 4,299,651
[45] Nov. 10, 1981

[54] PRODUCTION OF SINGLE CRYSTAL II-V MATERIAL

[75] Inventor: William A. Bonner, Warren, N.J.

[73] Assignee: Bell Telephone Laboratories, Incorporated, Murray Hill, N.J.

[21] Appl. No.: 204,525

[22] Filed: Nov. 6, 1980

Related U.S. Application Data

[63] Continuation of Ser. No. 47,214, Jun. 11, 1979, abandoned.

[51] Int. Cl.³ .................. C30B 15/04; C30B 15/22; C30B 29/44
[52] U.S. Cl. ........................... 156/617 SP; 156/618; 156/DIG. 65; 156/DIG. 70
[58] Field of Search ............... 156/601, 605, 617 SP, 156/618, DIG. 65, DIG. 70

[56] References Cited

PUBLICATIONS

K. J. Bachmann et al.; "Liquid Encapsulated Czochralski Pulling of InP Crystals"; *Jrnl. of Electronic Materials;* vol. 4; No. 2; 1975; pp. 389-406.

A. Steinemann et al.; "Growth Peculiarities of Gallium Arsenide Single Crystals"; *Solid-State Electronics;* vol. 6; 1963; pp. 597-604.

*Primary Examiner*—Frank Sever
*Attorney, Agent, or Firm*—Peter A. Businger

[57] ABSTRACT

Fabrication of single crystals of III-V semiconductor materials such as, e.g., indium phosphide by pulling from a melt may be hampered by twin formation. It has been discovered that twin formation is prevented by adjusting processing parameters such as, e.g., melt temperature, rotation rate, thermal gradients, and pull rate so as to limit rate of diameter enlargement of a boule. Specifically, diameter enlargement preferably does not exceed 0.3577 times the increase in length of a boule being pulled.

4 Claims, 4 Drawing Figures

PRODUCTION OF SINGLE CRYSTAL III-V MATERIAL

This application is a continuation of application Ser. No. 047,214, filed June 11, 1979, now abandoned.

TECHNICAL FIELD

The invention is concerned with the production of single crystal materials.

BACKGROUND OF THE INVENTION

Materials in single crystal form play a role in various device applications such as, e.g., semiconductor and, in particular, semiconductor optical devices. Examples of such optical devices are light emitting diodes, laser diodes, optical detectors, opto-isolators, and phototransistors as described, e.g., in the book by A. A. Bergh et al, *Light Emitting Diodes*, Clarendon Press, 1976. Devices may typically comprise a substrate and one or several deposited epitaxial layers, substrate and layers being rendered semiconducting or semi-insulating by the presence of appropriate dopants such as, e.g., S, Se, Sn, Zn, Te, Cd, Cr, or Fe. Among materials considered to be particularly suitable for optical device applications are doped and undoped III-V compounds.

The manufacture of device substrates typically involves cutting a single crystal boule which may have been produced by controlled solidification from a melt. Among controlled solidification techniques, pulling from a melt has proved particularly effective for III-V compounds such as, e.g., indium arsenide, gallium arsenide, gallium phosphide, and indium phosphide. In some instances, pulling may be carried out under atmospheric conditions; in others, pulling is preferably carried out under elevated pressure and from a melt whose surface is protected by an immiscible liquid. Apparatus for carrying out such socalled Liquid Encapsulated Czochralski growth has been disclosed by a number of authors and, in particular, by J. B. Mullin et al, "Liquid Encapsulation Crystal Pulling at High Pressures", *Journal of Crystal Growth*, Vol. 4 (1968), pp. 281-285; K. J. Bachman et al, "Liquid Encapsulated Czochralski Pulling of InP Crystals", *Journal of Electronic Materials*, Vol. 4 (1975), pp. 389-406; R. L. Henry et al, "InP Growth and Properties", *Journal of Electronic Materials*, Vol. 7 (1978), pp. 647-657; E. Buehler, "Simple Pressurized Chambers for Liquid Encapsulated Czochralski Crystal Growth", *Journal of Crystal Growth*, Vol. 43 (1978), pp. 584-588, the latter giving details of construction and operation of apparatus.

Achieved considerable advance in the development of crystal pulling methods notwithstanding, reliability of methods remains a concern in the reproducible preparation of single crystals. One concern, expressed for example by A. J. Marshall et al, "Growth of InP Crystals by the Synthesis Solute Diffusion Method", *Journal of Crystal Growth*, Vol. 44 (1978), pp. 651-652, is the formation of twinned crystals in the course of pulling from a melt.

SUMMARY OF THE INVENTION

A twin-free, single crystal boule consisting of a doped or undoped III-V compound is produced by pulling from a melt in a (111) direction and with the group V element plane in contact with the melt. Twinning is prevented by limiting rate of diameter enlargement versus longitudinal growth; specifically, the ratio of diameter enlargement to increase in length of a growing boule is maintained at values not exceeding 0.3577. Depending on composition, pulling is from a melt which is encapsulated with an immiscible liquid cover under a pressurized atmosphere.

DETAILED DESCRIPTION

Figure 1:
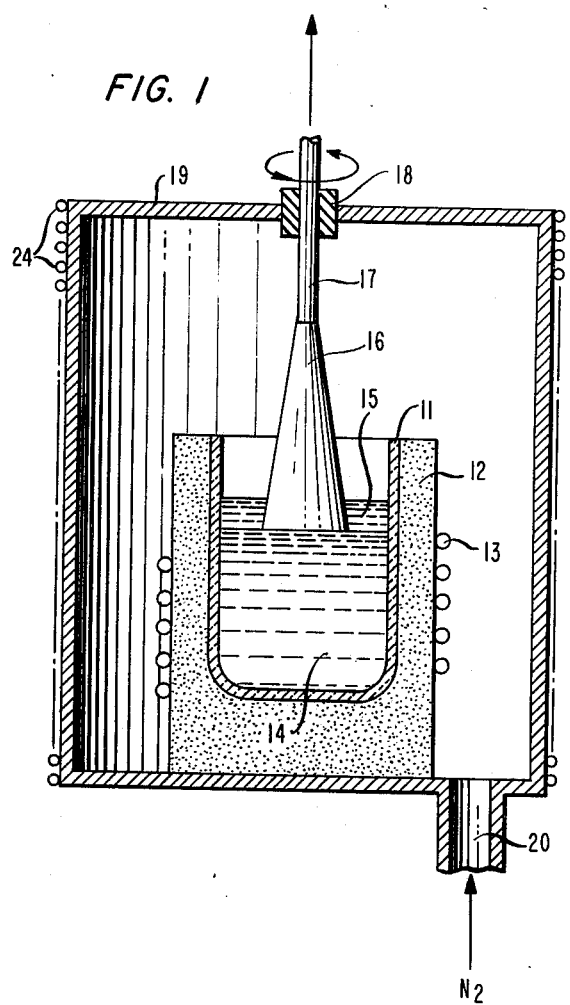
FIG. 1 shows schematically and in cross section a twin-free single crystal boule of a III-V compound being pulled from a melt according to the invention.

Apparatus which may be used to practice the invention is shown, in FIG. 1, to comprise crucible 11 which may be made, e.g., of fused silica or pyrolitic boron nitride. Crucible 11 is in contact with graphite susceptor 12 which is inside radio frequency coil 13. Crucible 11 contains melt 14 which is heated by heat generated in susceptor 12 exposed to a radiofrequency electromagnetic field produced by coil 13. Immiscible liquid cover 15 floats on melt 14. Single crystal boule 16 has an essentially vertical (111) growth direction with the group V element plane (also known as the B-plane) in contact with melt 14. Area of contact between boule 16 and melt 14 is essentially flat. Boule 16 is suspended by pull rod 17. Rod 17 leads through seal 18 which is attached to chamber 19, chamber 19 being supplied with a pressurized inert atmosphere through inlet 20. Water cooled pipes 24 are attached to chamber 19. Rod 17 is rotated and withdrawn as indicated by arrows.

Figure 2:
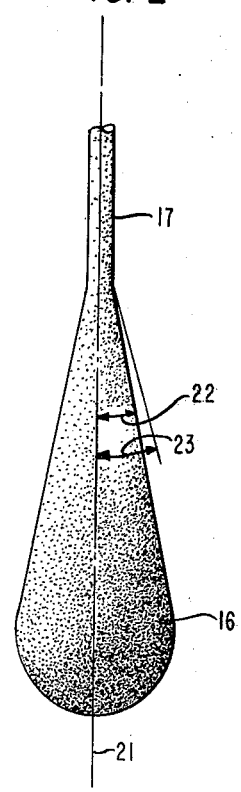
FIGS. 2-4 show schematically twin-free single crystal boules of different shapes as produced according to the invention.
Figure 3:
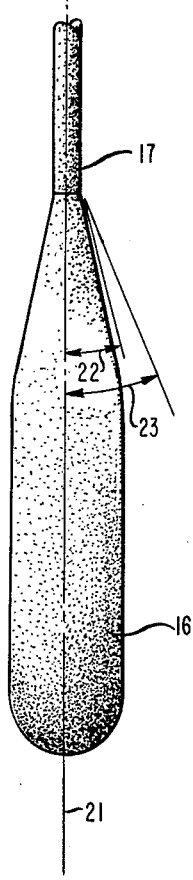
Figure 4:
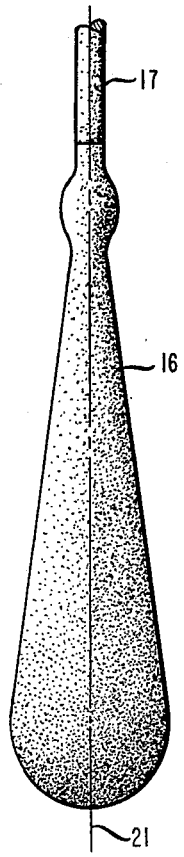

FIGS. 2-4 show boule 16 and rod 17 in correspondence with FIG. 1. Line 21 represents an axis of rotation for the boule, sections taken perpendicular to axis 21 being essentially circular in shape.

FIG. 2 shows a basic shape of a single crystal boule drawn according to the invention. An upper portion of the boule has the shape of a right circular cone having vertical half angle 22 which is less than limiting angle 23. Limiting angle 23 is approximately equal to 19.68 degrees.

FIGS. 3 and 4 show alternate shapes of a single-crystal boule made according to the invention. While shapes of boules shown in FIGS. 3 and 4 are not conical, such shapes share with the shape of FIG. 2 the property that planes which are tangential to the boule and which intersect rod 17 form an angle with axis 21 which does not exceed a limiting angle of approximately 19.68 degrees. Such desired shape is achieved by pulling a boule so as to limit diameter enlargement relative to vertical longitudinal growth to a value which does not exceed a limiting value corresponding to the tangent function evaluated at an angle of approximately 19.68 degrees, namely a value of approximately 0.3577.

Except possibly for the final reduction of diameter upon complete withdrawal of boule 16 from the melt, a further desirable limiting condition applies to the rate of diameter reduction. This limitation applies, e.g., in the case of the shape shown in FIG. 4 and calls for a rate of reduction in a diameter with respect to rate of vertical longitudinal growth which does not exceed a value of approximately 0.3577. The shape shown in FIG. 4 may be preferable to prevent the propagation of dislocations caused by defects in a seed crystal.

Prevention of twin formation as a result of limitation of rates of enlargement and reduction of diameter may be explained, without limiting the invention to such explanation, in terms of avoidance of contact between, on the one hand, melt surface and, on the other, (111) crystallographic orientations other than the vertical growth direction. In III-V materials, three such orientations form angles of approximately 70.32 degrees with the (111) vertical growth direction and are spaced evenly 120 degrees apart. Parallel planes perpendicular to such orientations form angles equal to approximately 19.68 degrees with axis 21.

Adjustment of processing parameters such as melt temperature, rotation rate, and rate of withdrawal so as to achieve limited diameter growth as specified above are conveniently monitored by visual inspection of a growing boule. Moreover, in the interest of an essentially flat interface between melt and boule surface in contact with the melt, a sufficiently uniform melt temperature is advantageous and, in particular, minimization of vertical temperature gradient in a melt is indicated.

The method is applicable to doped or undoped binary III-V compounds such as, e.g., InP, InAs, GaAs, and GaP as well as to multi-component compounds such as, e.g., ternary and quaternary congruently melting compounds. Impurities may be present so as to result in fewer than $10^{15}$ free carriers per $cm^3$ as in materials considered nominally undoped, or they may be present in amounts typically yielding up to $5 \times 10^{18}$ per $cm^3$ or more n- or p-type carriers.

EXAMPLE.

Polycrystalline indium phosphide was covered with a $B_2O_3$ layer and melted by heating to a temperature of approximately 1060-1070 degrees C. An atmosphere of nitrogen at 27 Atmospheres pressure was provided over the melt. A (111) seed crystal was lowered at the end of a pull rod through the $B_2O_3$ layer and brought into contact with the surface of the InP melt. The pull rod was rotated at approximately 25 RPM and withdrawn at a rate of approximately 0.6 inches per hour. A single crystal boule as illustrated by FIG. 1 was obtained. Other rates of rotation in the range of 20-30 RPM are also satisfactory; a pull rate of approximately 0.6 inches per hour is considered optimal when melt temperature is essentially constant along vertical lines. More generally, pull rates in the range of from 0.5 to 0.7 inches per hour are satisfactory, lower rates tending to favor twin formation and higher rates tending to favor dislocations.

I claim:

1. Method for making a twin-free single crystal boule of a doped or undoped III-V material, said method comprising the steps of providing a melt of said material, contacting the surface of said melt with a group V element plane of a seed crystal having (111) direction aligned essentially vertical, and vertically pulling said boule from said melt, pulling being under conditions under which an essentially flat interface is maintained between the surface of said melt and a surface of said boule, and pulling further being at a pull rate which is selected so as to limit ratio of enlargement of diameter of contact area between said boule and said melt versus increase in length of said boule to values not exceeding a value of 0.3577, whereby said single crystal boule is made twin-free.

2. Method of claim 1 in which pull rate is selected, except possibly for final reduction of diameter prior to removal of said boule from the surface of said melt, so as to limit ratio of reduction of diameter of contact area between said boule and said melt versus increase in length of said boule to values not exceeding a value of 0.3577.

3. Method of claim 1 in which an immiscible liquid is floated on said melt and an essentially inert atmosphere under pressure is provided over said liquid.

4. Method of claim 3 in which said material is doped or undoped indium phosphide and in which pull rate is in the range of 0.5 to 0.7 inches per hour.

* * * * *

UNITED STATES PATENT AND TRADEMARK OFFICE
CERTIFICATE OF CORRECTION

PATENT NO. : 4,299,651

DATED : November 10, 1981

INVENTOR(S) : William A. Bonner

It is certified that error appears in the above-identified patent and that said Letters Patent are hereby corrected as shown below:

In the Title, line 1; also, in the Specification, column 1, line 1, "II" should read --III--.

Signed and Sealed this

Ninth Day of February 1982

[SEAL]

Attest:

Attesting Officer

GERALD J. MOSSINGHOFF

Commissioner of Patents and Trademarks